(12) United States Patent
Kamei

(10) Patent No.: US 8,334,462 B2
(45) Date of Patent: Dec. 18, 2012

(54) WIRED CIRCUIT BOARD ASSEMBLY SHEET INCLUDING STRIATED PORTIONS FOR ENHANCING RIGIDITY

(75) Inventor: Katsutoshi Kamei, Osaka (JP)

(73) Assignee: Nitto Denko Corporation, Osaka (JP)

( * ) Notice: Subject to any disclaimer, the term of this patent is extended or adjusted under 35 U.S.C. 154(b) by 298 days.

(21) Appl. No.: 12/654,026

(22) Filed: Dec. 8, 2009

(65) Prior Publication Data

US 2010/0155113 A1    Jun. 24, 2010

Related U.S. Application Data

(60) Provisional application No. 61/193,989, filed on Jan. 15, 2009.

(30) Foreign Application Priority Data

Dec. 18, 2008  (JP) .................................. 2008-322894

(51) Int. Cl.
    *H05K 1/03*    (2006.01)

(52) U.S. Cl. ......................................................... 174/255
(58) Field of Classification Search .................. 174/255, 174/250, 256, 257; 361/732, 748, 760–769, 361/790–797
See application file for complete search history.

(56) References Cited

U.S. PATENT DOCUMENTS

2007/0170911 A1    7/2007    Ohsawa et al.

FOREIGN PATENT DOCUMENTS

| JP | 10-270830 | 10/1998 |
| JP | 2007-115828 | 5/2007 |
| JP | 2007-201085 | 8/2007 |

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A wired circuit board assembly sheet includes a plurality of wired circuit boards spaced to each other, and a plurality of striated portions extending between the respective wired circuit boards along a direction intersecting the lengthwise direction of the wired circuit boards.

7 Claims, 9 Drawing Sheets

FIG. 4
(a) 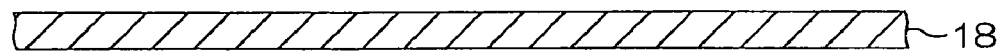
(b) 
(c) 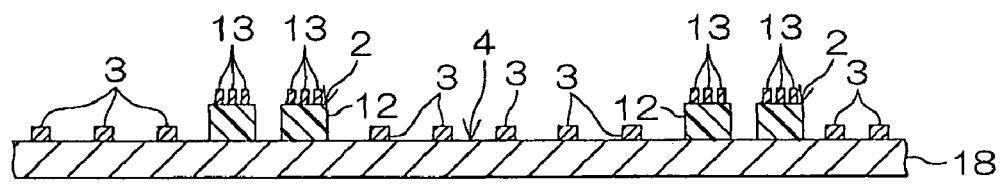
(d) 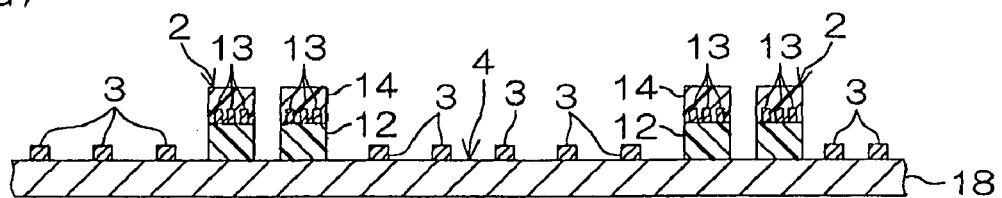
(e) 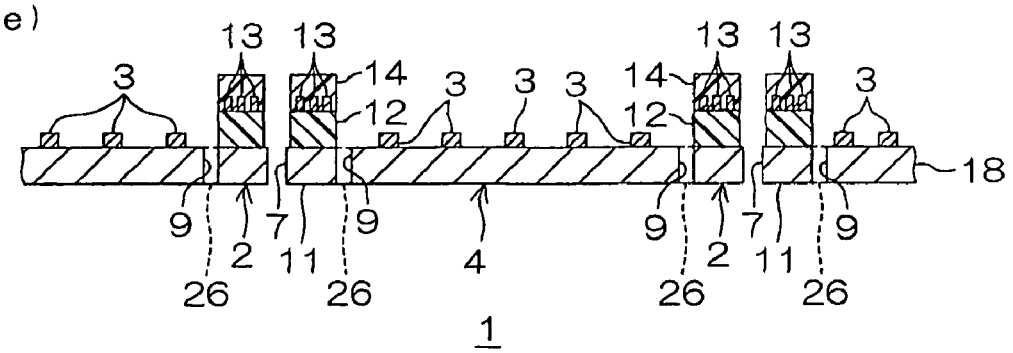

FIG. 5
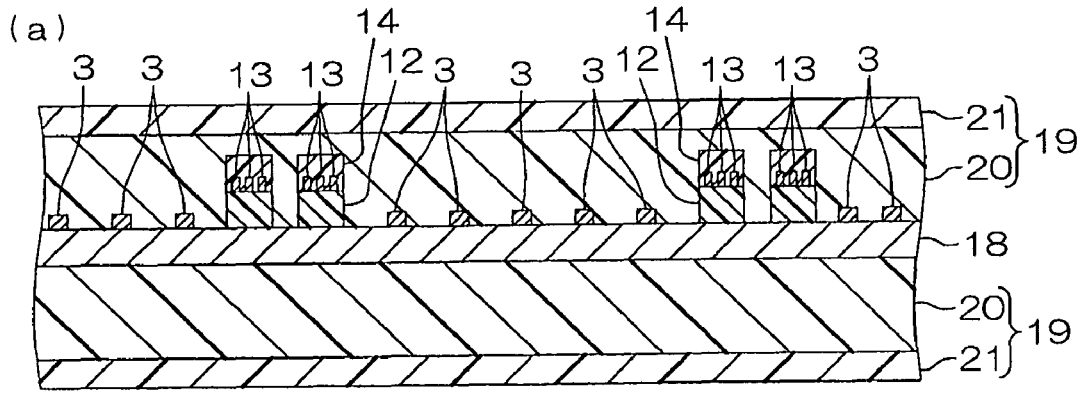
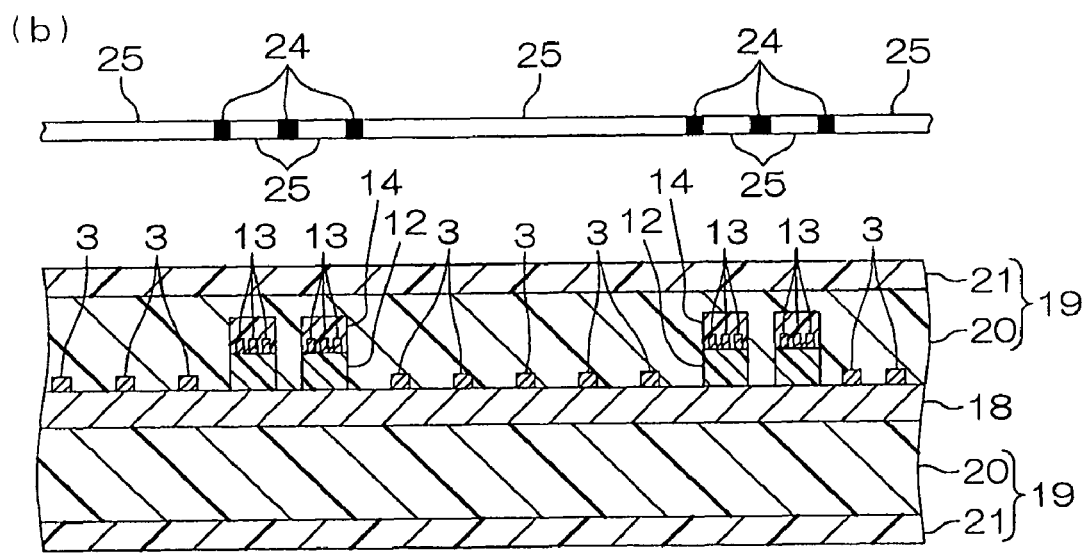
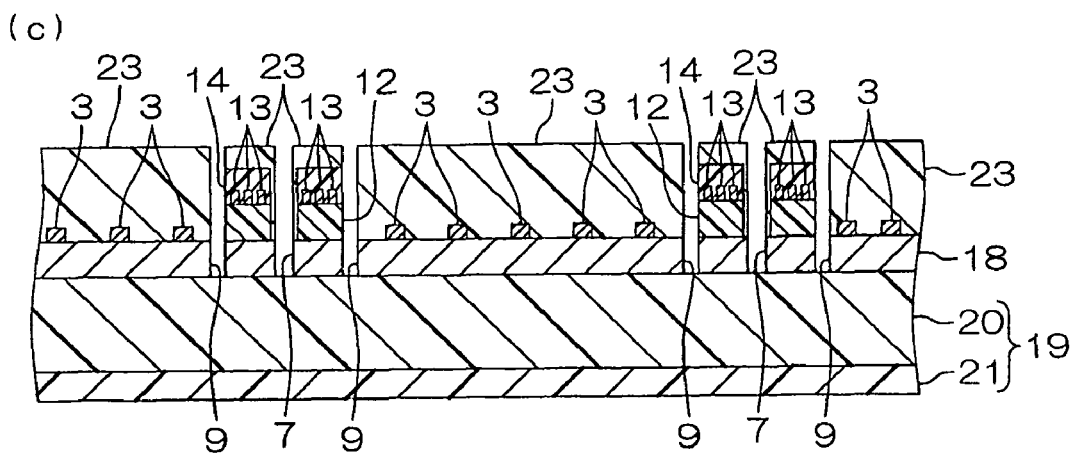

WIRED CIRCUIT BOARD ASSEMBLY SHEET INCLUDING STRIATED PORTIONS FOR ENHANCING RIGIDITY

CROSS-REFERENCE TO RELATED APPLICATIONS

This patent application claims the benefit of U.S. Provisional Application No. 61/193,989, filed on Jan. 15, 2009, and claims priority from Japanese Patent Application No. 2008-322894, filed on Dec. 18, 2008, the contents of which are herein incorporated by reference in their entirety.

BACKGROUND OF THE INVENTION

1. Field of the Invention

The present invention relates to a wired circuit board assembly sheet, and more particularly to a wired circuit board assembly sheet in which a plurality of wired circuit boards are formed.

2. Description of Related Art

A wired circuit board is usually produced in the form of a wired circuit board assembly sheet in which a plurality of wired circuit boards are formed in a single sheet, and each of the wired circuit boards is appropriately cut away from the wired circuit board assembly sheet for use in a variety of electric and electronic equipment (cf. Japanese Unexamined Patent Publication No. 2007-201085).

SUMMARY OF THE INVENTION

However, in the wired circuit board assembly sheet described in Japanese Unexamined Patent Publication No. 2007-201085, the wired circuit board may be deformed during the production of the wired circuit boards.

In particular, in the case where these wired circuit boards are suspension boards with circuits, a slider having a magnetic head mounted thereon is mounted on a gimbal of the suspension board with circuit, and the slider, the suspension board with circuit, and a load beam on which the suspension board with circuit is mounted need to be positioned accurately with respect to each other.

Therefore, a reference hole is formed in the suspension board with circuit and used as a positioning reference to position the suspension board with circuit and the load beam. This positioning allows the slider mounted on the gimbal of the suspension board with circuit, the suspension board with circuit, and the load beam to be positioned with high accuracy.

However, when the suspension board with circuit is deformed during its production, the accuracy of the relative arrangement between the gimbal and the reference portion (reference hole) deteriorates. As a result, the accuracy of the relative positioning of the slider mounted on the gimbal, the suspension board with circuit, and the load beam may deteriorate.

For this reason, the wired circuit board assembly sheet capable of preventing deformation of the wired circuit board is required.

It is an object of the present invention to provide a wired circuit board assembly sheet with a simple structure capable of preventing a wired circuit board from being deformed during production of the wired circuit board.

The wired circuit board assembly sheet of the present invention includes a plurality of wired circuit boards spaced to each other, and a plurality of striated portions extending between the respective wired circuit boards along a direction intersecting the lengthwise direction of the wired circuit boards.

In the wired circuit board assembly sheet of the present invention, it is preferable that the striated portions are formed of a metal and/or a resin.

In the wired circuit board assembly sheet of the present invention, it is preferable that the striated portions are spaced in parallel to each other.

In the wired circuit board assembly sheet of the present invention, it is preferable that a bisector of an angle formed by intersecting straight lines along the lengthwise direction of the wired circuit boards and the lengthwise direction of the striated portions is parallel to the lengthwise direction of the wired circuit board assembly sheet.

In the wired circuit board assembly sheet of the present invention, it is preferable that the striated portions are arranged along directions intersecting both the lengthwise direction of the wired circuit boards and a direction perpendicular to the lengthwise direction of the wired circuit boards.

In the wired circuit board assembly sheet of the present invention, it is preferable that the striated portions are arranged over spaces between the respective wired circuit boards.

In the wired circuit board assembly sheet of the present invention, it is preferable that the wired circuit boards are suspension board with circuits.

According to the wired circuit board assembly sheet of the present invention, a plurality of striated portions extending in the direction which intersects the lengthwise direction of the wired circuit boards are provided between the respective wired circuit boards, so that it is possible to prevent deformation of the wired circuit boards during the production thereof.

BRIEF DESCRIPTION OF THE DRAWINGS

FIG. 4 is a process diagram illustrating the steps of producing the suspension-board-with-circuit assembly sheet,
  (a) showing the step of preparing a metal supporting board,
  (b) showing the step of laminating an insulating base layer on a surface of the metal supporting board,
  (c) showing the step of forming a conductive pattern on the surface of the insulating base layer and also forming striated portions on the surface of the metal supporting board,
  (d) showing the step of forming an insulating cover layer on the surfaces of the insulating base layer and the conductive pattern, and
  (e) showing the step of forming openings in the metal supporting board;

FIG. 5 is a process diagram illustrating the steps of forming openings in the metal supporting board by wet etching,
  (a) showing the step of forming a photoresist over the entire upper and lower surfaces of the metal supporting board shown in FIG. 4(d),
  (b) showing the step of exposing the photoresist to light through a photomask, and
  (c) showing the step of forming etching resist by development;

DETAILED DESCRIPTION OF PREFERRED EMBODIMENTS

Figure 1:
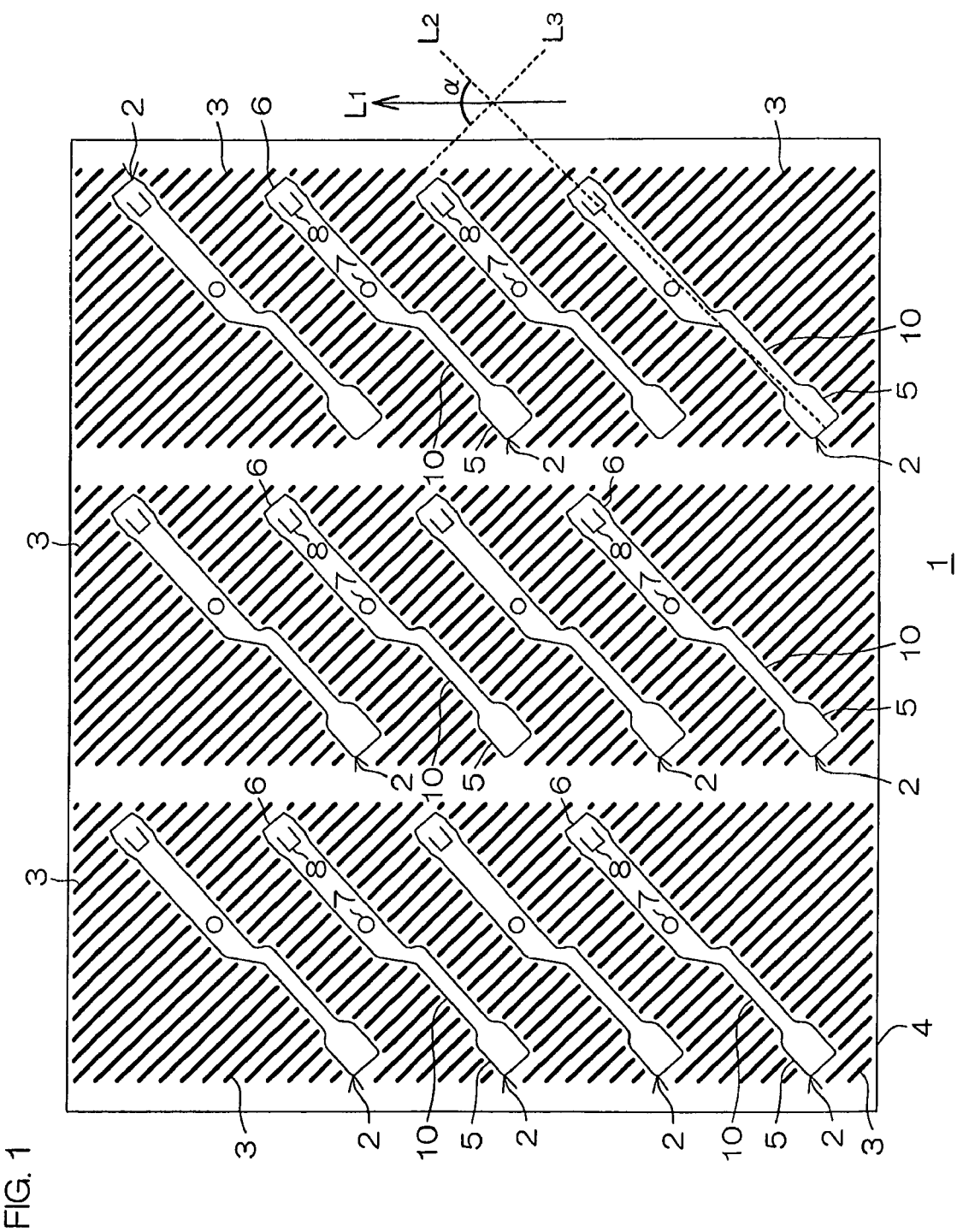
FIG. 1 is a plan view illustrating a suspension-board-with-circuit assembly sheet as an embodiment of a wired circuit board assembly sheet according to the present invention.
Figure 2:
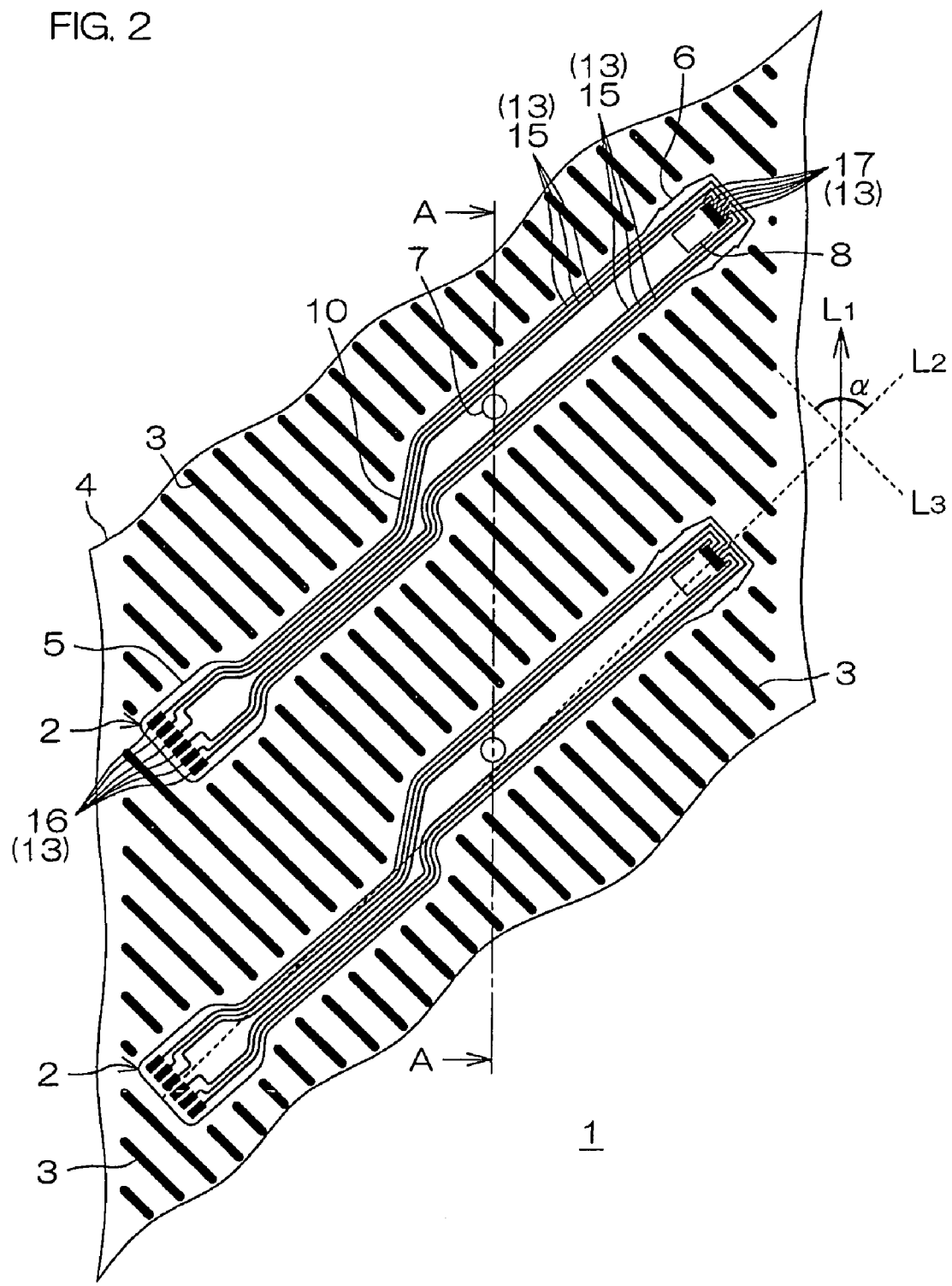
FIG. 2 is an enlarged plan view of a main portion of the suspension-board-with-circuit assembly sheet shown in FIG. 1.
Figure 3:
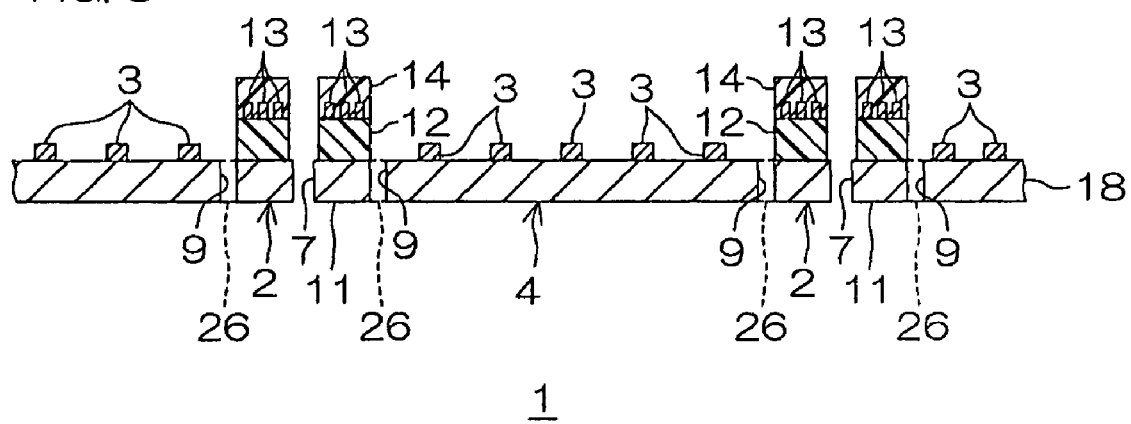
FIG. 3 is a sectional view taken along the line A-A in FIG. 2.

FIG. 1 is a plan view illustrating a suspension-board-with-circuit assembly sheet as an embodiment of a wired circuit board assembly sheet according to the present invention, FIG. 2 is an enlarged plan view of a main portion thereof, and FIG. 3 is a sectional view taken along the line A-A in FIG. 2. In FIG. 1, a clearance groove 9, an insulating base layer 12, a conductive pattern 13, an insulating cover layer 14, and a support 26, which are described later, are omitted. In FIG. 2, the clearance groove 9, the insulating base layer 12, the insulating cover layer 14, and the support 26, which are described later, are omitted.

In FIG. 1, this suspension-board-with-circuit assembly sheet 1 includes a plurality of suspension boards with circuits 2 serving as wired circuit boards, a plurality of striated portions 3, a support sheet 4 which supports the plurality of suspension boards with circuits 2 and striated portions 3.

Incidentally, the suspension-board-with-circuit assembly sheet 1 is produced by a roll-to-roll process, being transported along the lengthwise direction (solid-line arrow L1 in FIG. 1) of the sheet 1 in each of the steps shown in FIGS. 4 and 5.

The suspension boards with circuits 2 are arranged in spaced alignment with each other in the support sheet 4.

The suspension board with circuits 2 are used in a hard disk drive, each supports a magnetic head (not shown) mounted thereon while holding a minute gap between the magnetic head and a magnetic disk (not shown) against an airflow caused when the magnetic head and the magnetic disk travel relatively to each other, and is integrally formed with a conductive pattern 13 for connecting the magnetic head and a read/write board (not shown).

As shown in FIG. 2, each of the suspension board with circuits 2 is formed in a generally crank shape in plane view extending in the lengthwise direction, and integrally includes an external terminal 5 arranged on one side in the lengthwise direction (hereinafter referred to as the rear side), a gimbal 6 arranged on the other side in the lengthwise direction (hereinafter referred to as the front side), and a body portion 10 arranged between the external terminal portion 5 and the gimbal 6.

Incidentally, when referring to the relative position with respect to each of the striated portions 3 to be described later, the lengthwise direction of the suspension board with circuits 2 is defined as a direction along a straight line (dashed line L2 in FIG. 1) connecting between the widthwise center (the center between both ends of the front end edge) of the front end portion of the suspension board with circuit 2 and the widthwise center (the center between both ends of the rear end edge) of the rear end portion thereof.

The body portion 10 is formed in a generally crank shape in plane view extending in the lengthwise direction. As shown in FIGS. 1 and 2, the body portion 10 is provided with a positioning hole 7 serving as a positioning reference for installing the suspension board with circuit 2 on a load beam (not shown).

The positioning hole 7 is formed in the generally lengthwise center and widthwise center of the body portion 10 as a through hole having a generally circular shape in plane view penetrating the suspension board with circuit 2 in the thickness direction (i.e., penetrating a metal supporting layer 11 to be described later in the thickness direction).

The external terminal portion 5 is continuously formed from the rear end of the body portion 10, while having a generally rectangular shape in plane view expanding toward both widthwise outer sides of the body portion 10.

The gimbal 6 is continuously formed from the front end of the body portion 10, while having a generally rectangular shape in plane view expanding toward both widthwise outer sides of the body portion 10. The gimbal 6 is also formed with a slit portion 8 having a generally U-shape opening toward the front side in plane view. The slit portion 8 is formed penetrating the suspension board with circuit 2 in the thickness direction (i.e., penetrating the metal supporting layer 11 to be described later in the thickness direction). In a region sandwiched by the slit portion 8 in the widthwise direction, a slider (not shown) is mounted.

The conductive pattern 13 integrally includes an external connecting terminal portion 16, a magnetic-head-side connecting terminal portion 17, and a signal wire 15 for connecting the external connecting terminal portion 16 and the magnetic-head-side connecting terminal portion 17.

A plurality (six pieces) of the signal wires 15 are provided along the lengthwise direction of the suspension board with circuits 2, each signal wire 15 arranged in parallel at spaced intervals to each other in the widthwise direction.

More specifically, the signal wires 15 are arranged in the body portion 10 so as to extend in parallel to each other. In the external terminal portion 5, the signal wires 15 are arranged so as to extend rearward of the external terminal portion 5 and finally reach the front end portion of the external connecting terminal portion 16. In the gimbal 6, the signal wires 15 are arranged so as to pass through both the widthwise outer sides of the slit portion 8 to reach the front end portion of the gimbal 6, then folded back toward the rear side of the gimbal 6 in the lengthwise direction, and finally reach the front end portion of the magnetic-head-side connecting terminal portion 17.

A plurality (six pieces) of the external connecting terminal portions 16 are provided in the rear end portion of the external terminal portion 5, and arranged, each connected with the rear end portion of each of the signal wires 15. Further, the external connecting terminal portions 16 are spaced to each other in the widthwise direction. A terminal portion of an external circuit board, which is not shown, is connected to the external connecting terminal portions 16.

The magnetic-head-side connecting terminal portion 17 is arranged in the front end portion of the gimbal 6. A plurality (six pieces) of the magnetic-head-side connecting terminal portions 17 are provided each connected with the front end portion of each of the signal wires 15. Further, the magnetic-head-side connecting terminal portions 17 are spaced to each other in the widthwise direction. A terminal portion of a magnetic head (not shown) mounted on the slider, which is not shown, is connected to the magnetic-head-side connecting terminal portion 17.

As shown in FIGS. 2 and 3, each of the suspension board with circuits 2 includes a metal supporting layer 11, an insulating base layer 12 formed on a surface of the metal supporting layer 11, a conductive pattern 13 formed on the surface of the insulating base layer 12, and an insulating cover layer 14 formed on the surface of the insulating base layer 12 so as to cover the conductive pattern 13.

As shown in FIGS. 2 and 3, the metal supporting layer 11 is formed of a metal supporting board 18 (see FIG. 4) together with the support sheet 4 to be described later, corresponding to the positioning hole 7, the slit portion 8, and the outer shape of the suspension board with circuit 2. The metal that may be used to form the metal supporting board 18 including the metal supporting layer 11 includes, for example, stainless steel and 42 alloys, or preferably stainless steel. The metal supporting layer 11 has a thickness in the range of, for example, 10 to 60 μm, or preferably 15 to 30 μm.

As shown in FIG. 3, the insulating base layer 12 is formed on the metal supporting layer 11 as a pattern corresponding to a portion where the conductive pattern 13 is formed. The insulator that may be used to form the insulating base layer 12 includes, for example, synthetic resin such as polyimide resin, acrylic resin, polyether nitrile resin, polyether sulfone resin, polyethylene terephthalate resin, polyethylene naphthalate resin, polyvinyl chloride resin, or the like. Of these, preferably a photosensitive synthetic resin, or more preferably, photosensitive polyimide resin is used in order to form the insulating base layer 12 in a pattern. The insulating base layer 12 has a thickness in the range of, for example, 10 to 30 μm, or preferably 5 to 20 μm.

As shown in FIGS. 2 and 3, the conductive pattern 13 integrally includes the plurality of signal wires 15, magnetic-head-side connecting terminals 17, and external connecting terminals 16, all described above.

The conductor that may be used to form the conductive pattern 13 includes, for example, a metal foil such as copper, nickel, gold, solder, or alloys thereof. Preferably, a copper foil is used from the viewpoints of conductivity, low cost, and processability. The conductive pattern 13 has a thickness in the range of, for example, 1 to 25 μm, or preferably 5 to 15 μm. Each of the signal wires 15 (length in widthwise direction (perpendicular to the lengthwise direction)) has a width in the range of, for example, 10 to 150 μm, or preferably 20 to 100 μm, and a spacing between each of the signal wires 15 is in the range of, for example, 10 to 200 μm, or preferably 20 to 150 μm.

When the conductive pattern 13 is formed by an additive method to be described later, a ground layer (not shown) is interposed between each of the signal wires 15 and the insulating base layer 12. The ground layer is formed in the same pattern as the signal wires 15. The material that may be used to form the ground layer includes, for example, metallic materials such as chromium, gold, silver, platinum, nickel, titanium, silicon, manganese, zirconium, and alloys thereof, or oxides thereof. The ground layer has a thickness in the range of, for example, 0.01 to 1 μm, or preferably 0.01 to 0.1 μm.

As shown in FIG. 3, the insulating cover layer 14 is formed on the insulating base layer 12 as a pattern so as to cover the respective signal wires 15 and to expose the magnetic-head-side connecting terminal 17 and the external connecting terminal 16. As the insulator that may be used to form the insulating cover layer 14, the same insulator as that used to form the insulating base layer 12 is used, or preferably a photosensitive polyimide resin is used. The insulating cover layer 14 has a thickness in the range of, for example, 2 to 10 μm, or preferably 3 to 6 μm.

As shown in FIGS. 1 and 2, the suspension-board-with-circuit assembly sheet 1 includes a plurality of striated portions 3.

As shown in FIGS. 1 and 2, the striated portions 3 are formed diagonally between each of the suspension boards with circuits 2 so as to extend in the direction intersecting the lengthwise direction of the suspension board with circuits 2 and are arranged in the support sheet 4 to be described later.

The material that may be used to form the striated portions 3 includes, for example, metal or resin.

As for the metal, the same metal as that used in the conductor for forming the above-mentioned conductive pattern 13 such as a metal foil such as copper, nickel, gold, solder, or alloys thereof is used, or preferably a copper foil is used from the viewpoints of conductivity, low cost, and processability.

As for the resin, the same resin as that used in the insulator for forming the insulating base layer 12 and the insulating cover layer 14, both described above, for example, synthetic resin such as polyimide resin, acrylic resin, polyether nitrile resin, polyether sulfone resin, polyethylene terephthalate resin, polyethylene naphthalate resin, polyvinyl chloride resin, or the like is used. Of these, preferably a photosensitive synthetic resin, or more preferably, a photosensitive polyimide resin is used.

The materials that may be used to form the striated portions 3 may be used alone or in combination of two or more kinds.

Each of the striated portions 3 has substantially the same thickness as that of the conductive pattern 13, that is, for example, 1 to 25 μm, or preferably 5 to 15 μm, and has a width in the range of, for example, 5 to 1000 μm, or preferably 15 to 100 μm.

In the case of forming the striated portions 3 of metal, when the striated portions 3 are formed by an additive method to be described later, the ground layer (not shown) is interposed between each of the striated portions 3 and the metal supporting board 18. The ground layer is formed in the same pattern as the striated portions 3.

The angle formed by intersecting the straight line (dashed line L3 in FIG. 1) along the lengthwise direction of each of the striated portions 3 and the straight line (dashed line L2 in FIG. 1) along the lengthwise direction of the suspension board with circuits 2 (hereinafter referred to as intersection angle α. Incidentally, the intersection of the straight line along the lengthwise direction of each of the striated portions 3 and the straight line along the lengthwise direction of each of the suspension boards with circuits 2 forms vertical angles adjacent to each other along the transport direction of the suspension-board-with-circuit assembly sheet 1 and vertical angles adjacent to each other along a direction perpendicular to the transport direction of the suspension-board-with-circuit assembly sheet 1. It should, however, be noted that the intersection angle α is defined as one of the vertical angles adjacent to each other along the transport direction of the suspension-board-with-circuit assembly sheet 1.) is not particularly limited and, for example, exceeds 0° and less than 180°, preferably exceeds 15° and less than 165°, or more preferably exceeds 80° and less than 100°.

The formation of the striated portions 3 can prevent the suspension boards with circuits 2 from deforming during the production of the suspension boards with circuits 2.

Further, each of the suspension boards with circuits 2 and each of the striated portions 3 are arranged so that a bisector of the angle formed by intersecting the straight line along the lengthwise direction of the suspension board with circuits 2 and the straight line along the lengthwise direction of the striated portions 3 is preferably parallel to the lengthwise direction of the suspension-board-with-circuit assembly sheet 1 (i.e., while the straight line along the lengthwise direction of each of the suspension boards with circuits 2 and the straight line along the lengthwise direction of the suspension-board-with-circuit assembly sheet 1 intersect at an angle of α/2, the straight line along the lengthwise direction of each of the striated portions 3 and the straight line along the lengthwise direction of the suspension-board-with-circuit assembly sheet 1 intersect at an angle of α/2).

Thus, as long as the suspension boards with circuits 2 and the striated portions 3 are arranged in such a manner, deformation of the suspension boards with circuits 2 can be more effectively prevented.

As referred to FIG. 8 to be described later, the respective striated portions 3 are arranged preferably along the directions which intersect both the lengthwise direction of the suspension board with circuits 2 and the direction perpendicular thereto.

When each of the striated portions 3 is arranged in the above-mentioned manner, deformation of the suspension boards with circuits 2 can be more satisfactorily prevented.

Each of the intersection angles α in such case exceeds 90° and less than 180°, or preferably exceeds 130° and less than 150°.

The intersection angles α in the striated portions 3 (i.e., the intersection angle α in one filamentary portion 3 and the intersection angles α in the other filamentary portion(s) 3) may be the same or different from each other. Preferably, the intersection angles α in the striated portions 3 may be equal to each other (i.e., the striated portions 3 are spaced in parallel relation from each other).

When the intersection angles α in the striated portions 3 are equal to each other, the suspension-board-with-circuit assembly sheet 1 can have further improved rigidity with respect to a specific direction, which can further suppress deformation of the suspension boards with circuits 2 with respect to the specific direction.

The spacings between the respective striated portions 3, which are arranged in parallel, may be the same or different from each other, and is, for example, 5 to 1000 µm, or preferably 15 to 300 µm.

The striated portions 3 are preferably arranged over the spaces between the respective suspension boards with circuits 2.

The arrangement of the striated portions 3 over the spaces between the respective suspension boards with circuits 2 can improve the rigidity of the entire suspension-board-with-circuit assembly sheet 1 uniformly. Thus, deformation of the suspension board with circuit(s) 2 can be more reliably prevented.

The support sheet 4 corresponds to all the regions, except the regions where the suspension boards with circuits 2 (metal supporting layers 11) are arranged in the metal supporting board 18, as shown in FIGS. 1 and 2.

The metal supporting board 18 has clearance grooves 9 (see FIG. 3) surrounding the peripheries of the suspension boards with circuits 2 formed between the support sheet 4 and the respective suspension boards with circuits 2. The width of the clearance groove 9 is usually set in the range of 0.1 to 10 mm.

Each of the suspension boards with circuits 2 is coupled with the support sheet 4 by a plurality of supports 26 (see FIG. 3) across the clearance grooves 9. The plurality of supports 26 are arranged around the suspension boards with circuits 2 in spaced relation to each other, and each formed so as to pass from the inner peripheral portion of the support sheet 4 in a direction perpendicular to the clearance groove 9 and finally reach the outer peripheral portion of the suspension board with circuit 2.

FIG. 4 is a process diagram illustrating the steps of producing the suspension-board-with-circuit assembly sheet 1.

Next, a method for producing the suspension-board-with-circuit assembly sheet 1 is described with reference to FIG. 4.

In this method, a metal supporting board 18 is first prepared, as shown in FIG. 4(a). As referred to FIG. 1, the metal supporting board 18 is formed of a flat plate having a generally rectangular shape in plane view.

Subsequently, in this method, as shown in FIG. 4(b), a plurality of insulating base layers 12 are simultaneously formed on the metal supporting board 18 in a pattern corresponding to each of the suspension boards with circuits 2.

For formation of the respective insulating base layers 12, for example, a solution (varnish) of synthetic resin is applied to a surface of the metal supporting board 18 in the above-mentioned pattern and then dried. Next, the dried solution is heated to be cured as required. Alternatively, in the case of using a photosensitive synthetic resin, the photosensitive synthetic resin is applied to the entire surface of the metal supporting board 18. Subsequently, the photosensitive synthetic resin is exposed to light and developed to form the above-mentioned pattern, and then heated to be cured as required. Further, the process of forming the insulating base layers 12 is not limited to the above-mentioned manner, and the insulating base layers 12 can be formed, for example, by preliminarily forming a synthetic resin into a film having the above-mentioned pattern, and then adhesively bonding the film to a surface of the metal supporting board 18 through a known adhesive layer.

Then, in this method, as shown in FIG. 4(c), a conductive pattern 13 and a filamentary portion 3 are simultaneously formed on the surface of the insulating base layer 12 of each of the suspension boards with circuits 2 and on the surface of the metal supporting board 18 between each of the suspension boards with circuits 2, respectively, in a pattern corresponding thereto.

A known patterning method, such as an additive method or a subtractive method, is used to form the conductive patterns 13 and the striated portions 3. Preferably, an additive method is used.

In the additive method, a ground layer, which is not shown, is first formed over the entire upper surface of the insulating base layers 12 and the metal supporting board 18 (except the region where the insulating base layers 12 are formed). The ground layer is formed by sequentially laminating a thin chromium film and a thin copper film by sputtering, or preferably chromium sputtering and copper sputtering. Next, in this method, a photoresist is formed over the entire upper and lower surfaces of the insulating base layers 12 and the metal supporting board 18 (except the region where the insulating base layers 12 are formed) on which the ground layer is laminated. The photoresist is formed in the form of a laminated film of a dry film resist and a protective sheet, which protects the resist, made of PET (polyethylene terephthalate) or the like.

Subsequently, in this method, the photoresist on the upper side is exposed to light through a photomask and then developed to thereby form a plating resist in a pattern reverse to the conductive patterns 13 and the striated portions 3.

The pattern for forming the conductive patterns 13 and the pattern for forming the striated portions 3 are integrally formed in the photomask. Specifically, the photomask has a light shielding portion which does not transmit light and a light transmitting portion which transmits light in the above-mentioned pattern. In the case of patterning in a negative development process, the photomask is arranged so that the light shielding portion is opposed to a portion where the conductive patterns 13 and the striated portions 3 are formed and the light transmitting portion is opposed to a portion where the conductive patterns 13 and the striated portions 3 are not formed, and is then exposed to light.

Thereafter, the protective sheet is stripped off from the photoresist on the upper side, and an unexposed portion to which the light shielding portion has been opposed, that is, a portion where the conductive patterns 13 and the striated portions 3 are formed, is removed by development. For example, a dipping or spraying method is used for the development.

Thus, a plating resist is formed on the upper surfaces of the insulating base layers 12 and the metal supporting board 18 (except the region where the insulating base layers 12 are formed), on which the ground layer is laminated, in a pattern reverse to the conductive patterns 13 and the striated portions 3.

In the case of patterning the photomask with a positive image, although not shown, a process reverse to the above is performed, that is, the light transmitting portion of the photomask is opposed to the portion where the conductive patterns 13 and the striated portions 3 are formed, is exposed to light, and is then developed.

Then, the conductive patterns 13 are formed on the upper surface of the ground layer exposed from the plating resist in a predetermined pattern, for example, by electrolytic plating, or preferably by electrolytic copper plating, and the striated portions 3 are formed on the upper surface of the metal supporting board 18 exposed from the plating resist in a predetermined pattern.

Thereafter, the plating resist and the photoresist on the upper and lower surfaces, respectively, of the insulating base layer 12 and the metal supporting board 18 where the ground layer are laminated are removed, for example, by etching, peeling, or the like, and subsequently, the ground layer in a portion where the plating resist has been laminated, is removed, for example, by etching, peeling, or the like.

Thus, the conductive patterns 13 are formed on the insulating base layers 12 in the above-mentioned pattern having the signal wires 15, the external connecting terminals 16, and the magnetic-head-side connecting terminals 17, and the striated portions 3 are formed between the respective insulating base layers 12 in the above-mentioned pattern (e.g., the width of each of the striated portions 3 is 50 μm, the spacing between each of the striated portions 3 is 300 μm, and each of the intersection angles α is 90°).

Then, in this method, as shown in FIG. 4(d), an insulating cover layer 14 is formed on the insulating base layer 12 so as to cover the conductive pattern 13 of each of the suspension boards with circuits 2 and to expose the magnetic-head-side connecting terminals 17 and the external connecting terminals 16.

The respective insulating cover layers 14 are formed, for example, by applying the above-mentioned solution of synthetic resin in the above-mentioned pattern, drying the applied resin, and then heating the dried resin to be cured as required. Alternatively, the respective insulating cover layers 14 may be formed in the following manner. A photosensitive synthetic resin is applied to the entire surfaces of the metal supporting board 18 (including the striated portions 3) and the insulating base layers 12 (including the conductive patterns 13). Subsequently, the applied photosensitive synthetic resin is exposed to light and developed to form the above-mentioned pattern, and then heated to be cured as required. Further, the process of forming the respective insulating cover layers 14 is not limited to the above-mentioned manner, and the insulating cover layers 14 may be formed, for example, by preliminarily forming a synthetic resin into a film having the above-mentioned pattern, and then adhesively bonding the film on the insulating base layers 12 of the respective suspension boards with circuits 2 through a known adhesive layer.

Thus, each of the insulating cover layers 14 is formed in a pattern in which openings are formed in the portions corresponding to the external connecting terminal portions 16 and the magnetic-head-side connecting terminal portions 17, and the signal wires 15 are covered.

Then, in this method, as shown in FIG. 4(e), openings are formed in the metal supporting board 18 to form positioning holes 7 and clearance grooves 9, whereby outer shapes of the metal supporting layers 11 (i.e., suspension board with circuits 2) are formed.

To form the openings in the metal supporting board 18, a process of, for example, boring such as drilling, or for example, etching such as dry etching and wet etching, is used. Preferably, a wet etching process is used.

FIG. 5 is a process diagram illustrating the steps of forming openings in the metal supporting board by wet etching.

In the wet etching process, first, as shown in FIG. 5(a), a photoresist 19 is formed over the entire upper and lower surfaces of the metal supporting board 18 on which the insulating base layer 12, the conductive pattern 13, and the insulating cover layer 14 are laminated, and the striated portions 3 are formed. The photoresist 19 is formed in the form of a laminated film of a dry film resist 20 and a protective sheet 21, which protects the resist, made of PET or the like.

Then, in this method, as shown in FIG. 5(b), the photoresist 19 on the upper side is exposed to light through a photomask 22, and then developed as shown in FIG. 5(c), to thereby form an etching resist 23 in a pattern reverse to the positioning holes 7 and the clearance grooves 9.

As shown in FIG. 5(b), the pattern for forming the positioning holes 7 and the clearance grooves 9 is integrally formed in the photomask 22. Specifically, the photomask 22 has a light shielding portion 24 which does not transmit light and a light transmitting portion 25 which transmits light in the above-mentioned pattern. In the case of patterning in a negative development process, the photomask 22 is arranged so that the light shielding portion 24 is opposed to a portion where the positioning holes 7 and the clearance grooves 9 are formed and the light transmitting portion 25 is opposed to a portion where the positioning holes 7 and the clearance grooves 9 are not formed, and is then exposed to light.

Thereafter, the protective sheet 21 is stripped off from the photoresist 19 on the upper side, and as shown in FIG. 5(c), an unexposed portion to which the light shielding portion 24 is opposed, that is, a portion where the positioning holes 7 and the clearance grooves 9 are formed, is removed by development. For example, a dipping or spraying method is used for the development.

Thus, the etching resist 23 is formed on the upper surface of the metal supporting board 18, on which the insulating base layer 12, the conductive pattern 13, and the insulating cover layer 14 are laminated and the striated portions 3 are formed, in the pattern reverse to the positioning holes 7 and the clearance grooves 9.

In the case of patterning the photomask with a positive image, although not shown, a process reverse to the above is performed, that is, the light transmitting portion 25 of the photomask 22 is opposed to the portion where the positioning holes 7 and the clearance grooves 9 are formed, is exposed to light, and is then developed.

Next, using a known etchant such as an aqueous ferric chloride solution, openings are formed in the metal supporting board 18 to form the positioning holes 7 and the clearance grooves 9.

Thereafter, the etching resist 23 on the upper side and the photoresist 19 (i.e., the dry film resist 20 and the protective sheet 21) on the lower side are removed, for example, by etching, peeling, or the like.

Thus, as shown in FIG. 4(e), the positioning holes 7 are formed and the clearance grooves 9 are also formed in the above-mentioned pattern, so that outer shapes of the metal supporting layers 11 (i.e., the suspension boards with circuits 2) can be formed. In addition, supports 26 are also formed simultaneously with the formation of the clearance grooves 9.

Incidentally, the metal supporting board 18 in a portion corresponding to the slit portion 8 is also etched at the same time when the positioning holes 7 and the clearance grooves 9 are formed.

Thus, the suspension-board-with-circuit assembly sheet 1 provided with the plurality of suspension boards with circuits 2, the plurality of striated portions 3, and the support sheet 4 can be obtained.

Since the suspension-board-with-circuit assembly sheet 1 includes a plurality of striated portions 3 extending along the direction intersecting the lengthwise direction of the suspension board with circuits 2, it is possible to prevent deformation of the suspension board with circuits 2 during the production thereof.

Specifically, for example, when the positioning holes 7, the slit portions 8, and the clearance grooves 9 are formed by wet etching, the following usual process as described above is performed. The photoresist 19 made of the dry film resist 20 and the protective sheet 21 is laminated, the photoresist 19 thus laminated is exposed to light, the protective sheet 21 is stripped off and then developed, to thereby form the etching resist 23.

In the step of laminating the photoresist 19, if the striated portions 3 are not formed, the tension of the protective sheet 21 causes deformation in the metal supporting board 18 on which the insulating base layer 12, the conductive pattern 13, and the insulating cover layer 14 are laminated. Then, when the photoresist 19 is exposed to light in such deformed state, the exposure is done with the photoresist 19 being misaligned by the deformed amount, so that the etching resist 23 cannot be formed as a pattern exactly corresponding to the position where the positioning hole 7, the slit portion 8, and the clearance groove 9 are formed. Therefore, the absence of the striated portions 3 may fail to form the positioning holes 7, the slit portions 8, and the clearance grooves 9 with excellent accuracy.

On the other hand, the suspension-board-with-circuit assembly sheet 1 has excellent rigidity because the striated portions 3 are formed.

Therefore, using the suspension-board-with-circuit assembly sheet 1, the deformation caused by the tension of the protective sheet 21 can be satisfactorily prevented, so that the positioning holes 7, the slit portions 8, and the clearance grooves 9 can be formed with excellent accuracy, thereby forming outer shapes of the suspension board with circuits 2.

As a result, according to the suspension-board-with-circuit assembly sheet 1, the sliders to be mounted on the gimbals 6 (the slit portions 8) of the suspension board with circuits 2, the suspension board with circuits 2, and the load beams on which the suspension board with circuits 2 are to be mounted using the positioning holes 7 as positioning references can be relatively arranged with excellent accuracy.

In the suspension-board-with-circuit assembly sheet 1, the striated portions 3 are spaced in parallel relation from each other.

Therefore, the suspension-board-with-circuit assembly sheet 1 can have further improved rigidity with respect to a specific direction, which can further suppress deformation of the suspension board with circuit(s) 2 with respect to the specific direction.

In the suspension-board-with-circuit assembly sheet 1, the striated portions 3 are arranged over the spaces between the suspension boards with circuits 2.

Therefore, the rigidity of the suspension-board-with-circuit assembly sheet 1 can be further improved, thereby more satisfactorily preventing deformation of the suspension boards with circuits 2 during the production thereof.

In the above description, although the striated portions 3 are formed together with the conductive patterns 13 using the conductor (metal) that forms the conductive pattern 13, the striated portions 3 may be formed of, for example, a resin.

Figure 6:
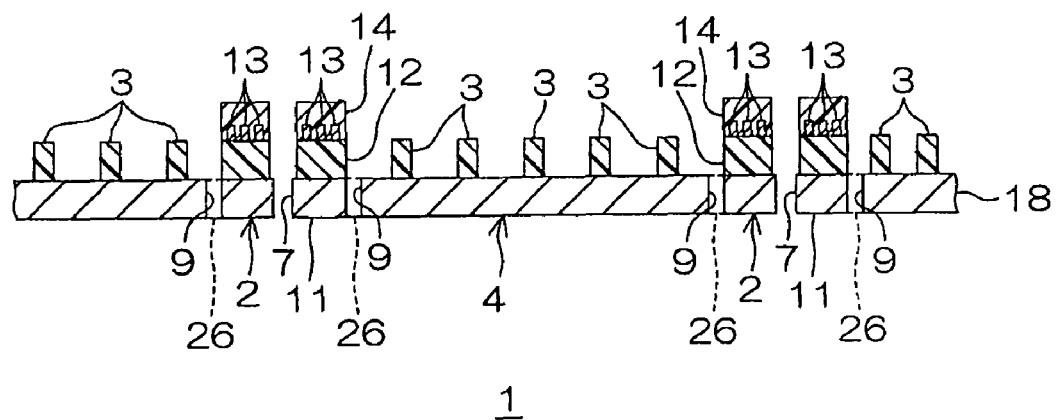
FIG. 6 is a sectional view showing the suspension-board-with-circuit assembly sheet shown in FIG. 3 as another embodiment (an embodiment in which striated portions are formed of a resin)

FIG. 6 is a sectional view showing the suspension-board-with-circuit assembly sheet 1 shown in FIG. 3 as another embodiment (an embodiment in which striated portions 3 are formed of a resin). The same reference numerals are provided in FIG. 6 for members corresponding to each of those described above, and their detailed description is omitted.

In the suspension-board-with-circuit assembly sheet 1, the striated portions 3 are formed of the same resin as that forms the insulating base layers 12, together with the insulating base layers 12 in the step of producing the insulating base layers 12.

Such striated portions 3 are formed together with the insulating base layers 12 in the following manner. For example, in the above-mentioned step of producing the insulating base layers 12, a photosensitive synthetic resin is applied to the entire surface of the metal supporting board 18. Subsequently, the photosensitive synthetic resin is exposed to light and developed to form the pattern corresponding to the respective striated portions 3 and the respective insulating base layers 12, and then heated to be cured as required.

In the suspension-board-with-circuit assembly sheet 1, the striated portions 3 are formed between the respective insulating base layers 12 on the metal supporting board 18 in the step of producing the conductive pattern 13. Therefore, in the above-mentioned production step, even when the photoresist (the dry film resist and the protective sheet) is laminated, deformation of the metal supporting board 18 can be prevented.

Therefore, the deformation of the suspension board with circuits 2 during the production thereof can be more satisfactorily prevented, so that the positioning holes 7 and the clearance grooves 9 can be formed with excellent accuracy, thereby forming outer shapes of the suspension board with circuits 2.

In particular, in the step of producing the conductive pattern 13, the presence of the striated portions 3 formed can improve the accuracy of the relative position of the magnetic-head-side connecting terminal portions 17 with respect to the positioning holes 7, the slit portions 8, and the clearance grooves 9. As a result, accurate alignment of the sliders to be mounted on the gimbals 6 (the slit portions 8) of the suspension board with circuits 2, the suspension board with circuits 2, and the load beams on which the suspension board with circuits 2 are to be mounted using the positioning holes 7 as positioning references can be ensured. Furthermore, the accurate alignment of the terminal portion of the magnetic head mounted on the slider and the magnetic-head-side connecting terminal portions 17 can be secured.

When the striated portions 3 are formed of a resin, though not shown, the striated portions 3 can be formed of the same resin as that forms the insulating cover layers 14, together with the insulating cover layers 14, in the step of producing the insulating cover layers 14.

Such striated portions 3 are formed together with the insulating cover layers 14 in the following manner. For example, in the above-mentioned step of producing the insulating cover layers 14, a photosensitive synthetic resin is applied to the entire surface of the metal supporting board 18 and the insulating base layers 12 (including the conductive patterns 13). Subsequently, the photosensitive synthetic resin is exposed to light and developed to form the pattern corresponding to the respective striated portions 3 and the respective insulating cover layers 14, and then heated to be cured as required.

In the above description, although the striated portions 3 are formed of a metal or a resin, the striated portions 3 may be formed of, for example, a metal and a resin.

Figure 7:
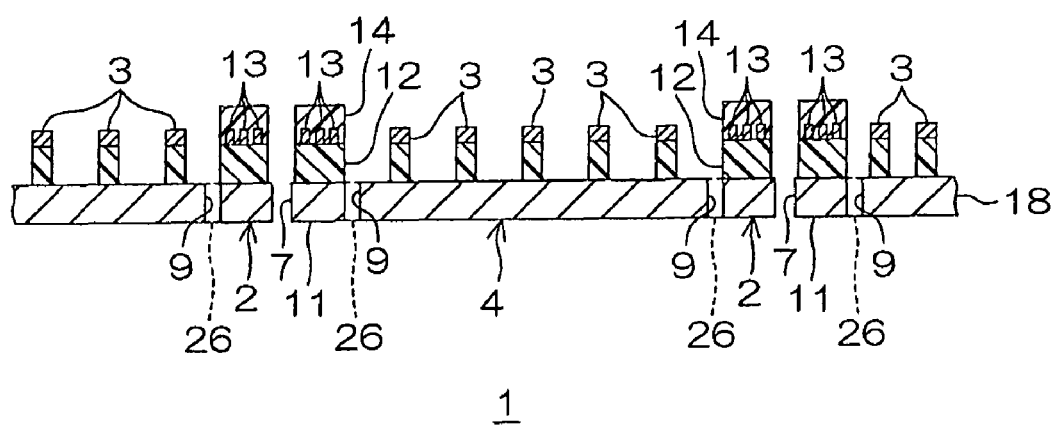
FIG. 7 is a sectional view showing the suspension-board-with-circuit assembly sheet shown in FIG. 3 as another embodiment (an embodiment in which striated portions are formed of a resin and a metal laminated on the upper surface of the resin)

FIG. 7 is a sectional view showing the suspension-board-with-circuit assembly sheet 1 shown in FIG. 3 as another embodiment (an embodiment in which striated portions 3 are formed of a resin and a metal laminated on the upper surface of the resin). The same reference numerals are provided in FIG. 7 for members corresponding to each of those described above, and their detailed description is omitted.

In the suspension-board-with-circuit assembly sheet 1, the striated portions 3 are formed of the same resin as that forms the insulating base layers 12 and the same metal as that forms the conductive patterns 13 laminated on the upper surface of the resin.

Such striated portions 3 are formed of a resin in a pattern in the following manner. For example, in the above-mentioned step of producing the insulating base layers 12, a photosensitive synthetic resin is applied to the entire surface of the metal supporting board 18. Subsequently, the photosensitive synthetic resin is exposed to light and developed to form the pattern corresponding to the respective striated portions 3 and the respective insulating base layers 12, and then heated to be cured as required.

Thereafter, in the above-mentioned step of producing the conductive patterns 13, a metal is laminated on the upper surface of the resin formed in the pattern corresponding to the striated portions 3 by the additive method, simultaneously with the conductive pattern 13, Thus, the striated portions 3 formed by laminating the resin and the metal sequentially can be formed.

In the suspension-board-with-circuit assembly sheet 1, since the striated portions 3 are formed of a resin and a metal, the rigidity of the suspension-board-with-circuit assembly sheet 1 can be further improved.

Therefore, the deformation of the suspension boards with circuits 2 during the production thereof can be more satisfactorily prevented, so that the positioning holes 7, the slit portions 8, and the clearance grooves 9 can be formed with excellent accuracy, thereby forming outer shapes of the suspension board with circuits 2.

When the striated portions 3 are formed of a resin and a metal, though not shown, for example, a metal is formed in the pattern corresponding to the striated portions 3 while the conductive patterns 13 are formed, and then a resin is formed on the upper surface of the metal while the insulating cover layers 14 are formed, thereby forming the striated portions 3 formed by laminating the metal and the resin sequentially. Further, for example, a resin is formed in the pattern corresponding to the striated portions 3 while the insulating base layers 12 are formed, and a metal is formed on the resin in the pattern corresponding to the striated portions 3 while the conductive patterns 13 are formed. Subsequently, a resin is formed on the metal in the pattern corresponding to the striated portions 3 while the insulating cover layers 14 are formed, so that the striated portions 3 formed by laminating the metal, the resin, and the resin sequentially may be formed.

In the above description, although each of the intersection angles $\alpha$ in the striated portions 3 is set to 90°, the intersection angle $\alpha$ may be set to any angle.

Figure 8:
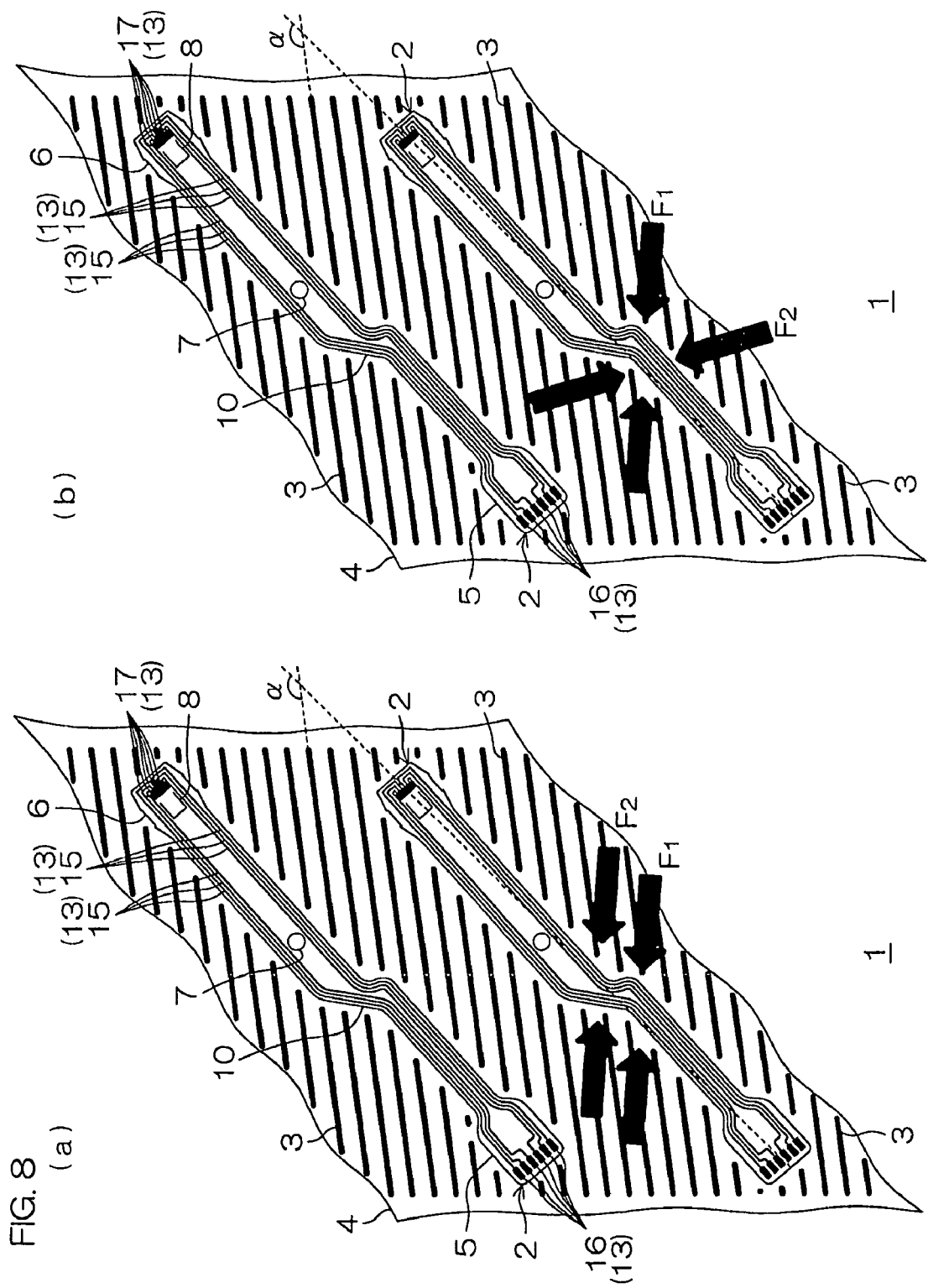
FIG. 8 is a sectional view showing the suspension-board-with-circuit assembly sheet shown in FIG. 2 as another embodiment (an embodiment in which an intersection angle α in each of the striated portions is 143°)

FIG. 8 is a sectional view showing the suspension-board-with-circuit assembly sheet 1 shown in FIG. 2 as another embodiment (an embodiment in which an intersection angle $\alpha$ in each of the striated portions 3 is 143°). The same reference numerals are provided in FIG. 8 for members corresponding to each of those described above, and their detailed description is omitted.

In the suspension-board-with-circuit assembly sheet 1, the respective striated portions 3 are arranged along the directions intersecting both the lengthwise direction of the suspension board with circuits 2 and the direction perpendicular thereto (specifically, each of the intersection angles $\alpha$ in the respective striated portions 3 is formed to be 143°).

In the suspension-board-with-circuit assembly sheet 1, since each of the intersection angles $\alpha$ in the striated portions 3 is set to the above-mentioned angle, the deformation of the suspension board with circuit(s) 2 can be prevented regardless of the directional property of the load (hereinafter simply referred to as load in some cases) produced by the tension of the protective sheet.

Specifically, for example, in the step of forming the conductive patterns 13, and the step of forming openings in the metal supporting board 18, when a protective sheet is laminated, a load (hereinafter referred to as load F1) in the step of forming the conductive patterns 13 and a load (hereinafter referred to as load F2) in the step of forming openings in the metal supporting board 18 are produced along various directions as shown in FIGS. 8(a) and (b).

Therefore, in these two steps, when a protective sheet is laminated, two cases are considered, a case where the loads F1 and F2 are applied from the same direction (see FIG. 8(a)) and a case where the loads F1 and F2 are applied from different directions (see FIG. 8(b)). To simplify the description, in FIGS. 8(a) and (b), the loads F1 and F2 are described only on the lower suspension-board-with-circuit 2 side.

For example, in the suspension board with circuit 2 (see FIG. 8(a)) to which the loads F1 and F2 are applied from the same direction, since the load is applied only from one direction, the suspension board with circuit 2 may tend to deform.

In such case, if each of the intersection angles $\alpha$ is set within the above range, deformation of the suspension board with circuit 2 caused when the loads F1 and F2 are applied from the same direction can be satisfactorily prevented.

On the other hand, for example, in the suspension board with circuit 2 (see FIG. 8(b)) to which the loads F1 and F2 are applied from different directions, the loads are applied from multiple directions, so that the suspension board with circuit 2 in this case may also tend to deform.

In such case, if each of the intersection angles $\alpha$ is set within the above range, even when the loads F1 and F2 are applied from different directions, deformation of the suspension board with circuit 2 can be satisfactorily prevented.

Therefore, setting of the intersection angle α within the above range can prevent deformation of the suspension board with circuit 2 when the loads F1 and F2 are applied from different directions, and such setting can also more satisfactorily prevent deformation of the suspension board with circuit 2 when the loads F1 and F2 are applied from the same direction.

In the above description, the intersection angles α in the respective striated portions 3 are the same between each of the suspension boards with circuits 2. However, for example, the intersection angles α may be different from each other between each of the suspension boards with circuits 2.

Figure 9:
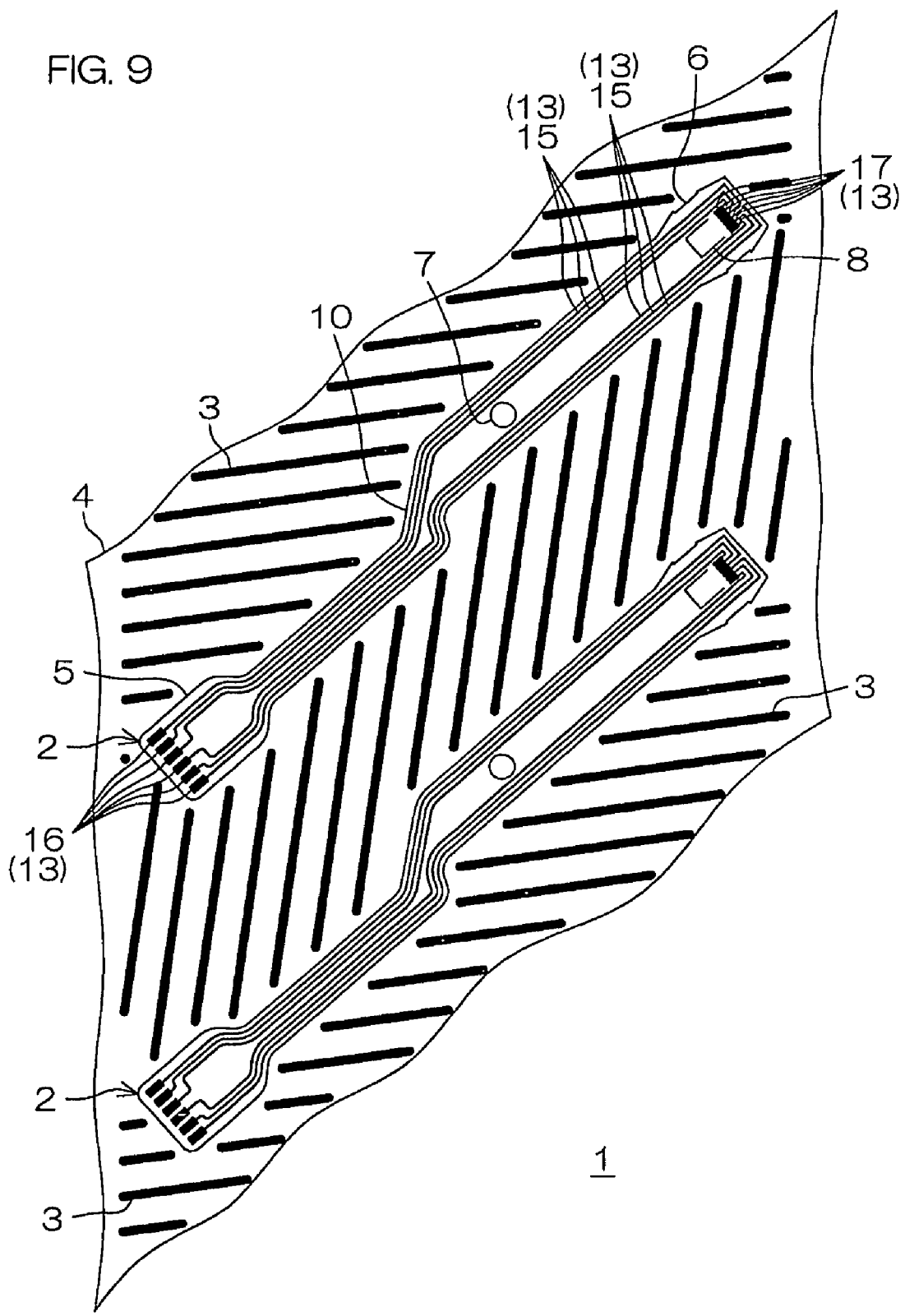
FIG. 9 is a sectional view showing the suspension-board-with-circuit assembly sheet shown in FIG. 2 as another embodiment (an embodiment in which the intersection angles α in the respective striated portions are different between the respective suspension boards with circuits)

FIG. 9 is a sectional view showing the suspension-board-with-circuit assembly sheet 1 shown in FIG. 2 as another embodiment (an embodiment in which the intersection angles α in the respective striated portions 3 are different between the respective suspension boards with circuits 2). The same reference numerals are provided in FIG. 9 for members corresponding to each of those described above, and their detailed description is omitted.

In the suspension-board-with-circuit assembly sheet 1, the striated portions 3 are formed by a constant intersection angle α (e.g., 143°) between some suspension boards with circuit 2, while the striated portions 3 are formed by a different intersection angle α from the above (e.g., 37°) between the other suspension boards with circuits 2.

In the suspension-board-with-circuit assembly sheet 1, since the intersection angle α in each of the striated portions 3 is appropriately selected, the rigidity of the suspension-board-with-circuit assembly sheet 1 in any direction can be improved.

In the above description, the intersection angles α in the respective striated portions 3 are the same between some suspension boards with circuits 2 (i.e., the striated portions 3 are arranged in parallel between some suspension boards with circuits 2). However, for example, the intersection angles α may be different from each other between some suspension boards with circuits 2.

Figure 10:
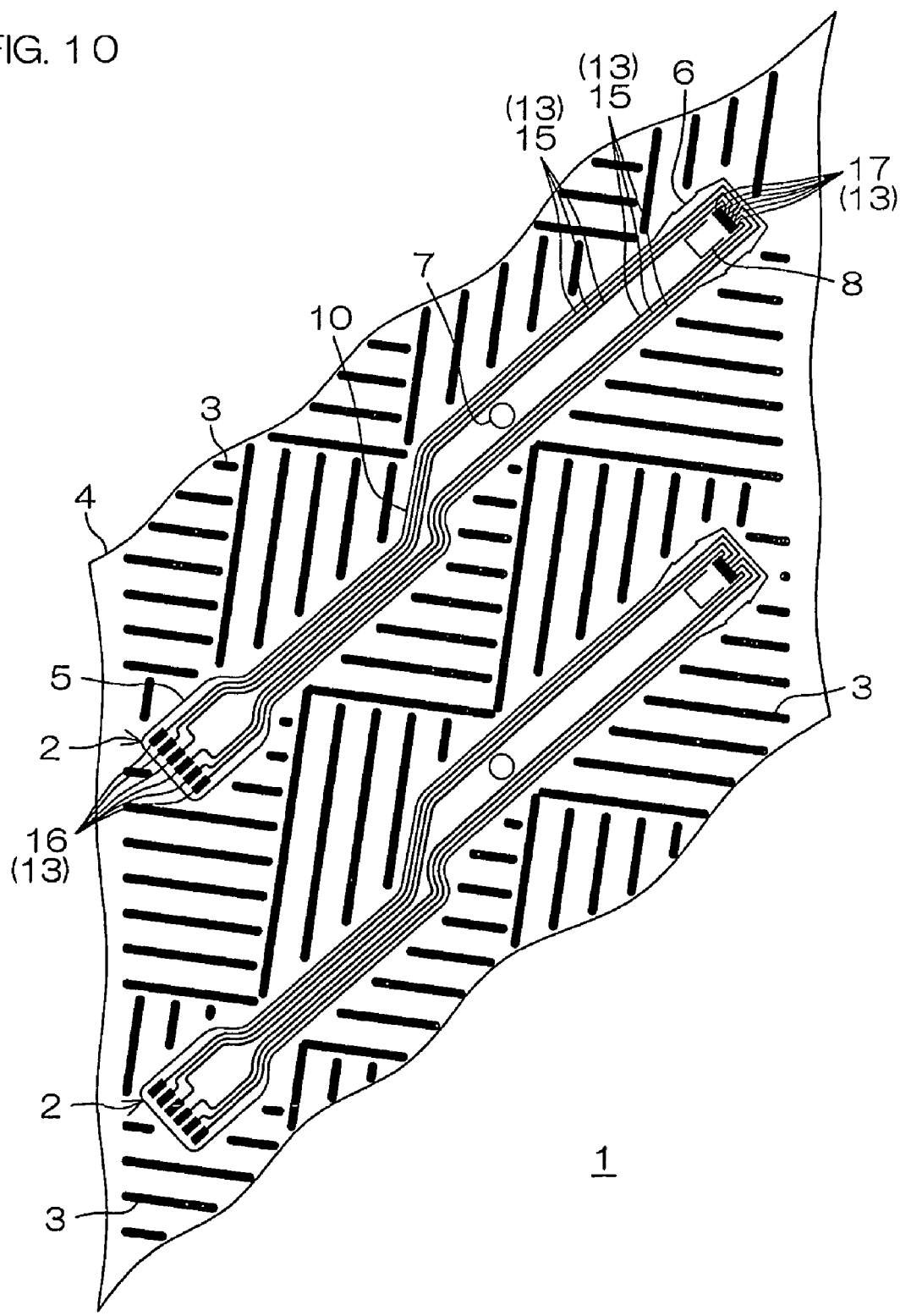
FIG. 10 is a sectional view showing the suspension-board-with-circuit assembly sheet shown in FIG. 2 as another embodiment (an embodiment in which the intersection angles α in the respective striated portions are different between suspension boards with circuits).

FIG. 10 is a sectional view showing the suspension-board-with-circuit assembly sheet 1 shown in FIG. 2 as another embodiment (an embodiment in which the intersection angles α in the respective striated portions 3 are different between suspension boards with circuits 2). The same reference numerals are provided in FIG. 10 for members corresponding to each of those described above, and their detailed description is omitted.

In the suspension-board-with-circuit assembly sheet 1, the striated portions 3 are not formed by a constant intersection angle α between some suspension boards with circuits 2, but are formed by different intersection angles α.

Specifically, between some suspension boards with circuits 2, some striated portions 3 are formed so that the intersection angle α is 37° while the other striated portions 3 are formed so that the intersection angle α is 127°.

In the suspension-board-with-circuit assembly sheet 1, since the intersection angle α in each of the striated portions 3 is appropriately selected, the rigidity of the suspension-board-with-circuit assembly sheet 1 in any direction can be improved.

<Evaluation>

The degree of deformation of the suspension board with circuit(s) 2 when a specific stress load is applied to the suspension-board-with-circuit assembly sheet 1 was measured by computer simulation.

Incidentally, in the computer simulation, assuming a load F1 (load applied in the step of forming the conductive pattern 13) and a load F2 (load applied in the step of forming openings in the metal supporting board 18), the degree of deformation of the suspension board with circuit(s) 2 was measured in the case where the loads F1 and F2 are applied from the same direction (see FIG. 8(*a*)) and the case where the loads F1 and F2 are applied from different directions (see FIG. 8(*b*)).

The degree of deformation was measured for a suspension-board-with-circuit assembly sheet 1 (hereinafter referred to as suspension-board-with-circuit assembly sheet A) produced without forming the striated portions 3, a suspension-board-with-circuit assembly sheet 1 having an intersection angle α of 143° and produced so that the bisector of the angle formed by intersecting the straight line along the lengthwise direction of each of the suspension boards with circuits 2 and the straight line along the lengthwise direction of the striated portions 3 is parallel to the lengthwise direction of the suspension-board-with-circuit assembly sheet 1 (hereinafter referred to as suspension-board-with-circuit assembly sheet 13), and a suspension-board-with-circuit assembly sheet 1 having an intersection angle α of 90° and produced so that the bisector of the angle formed by intersecting the straight line along the lengthwise direction of the suspension boards with circuits 2 and the straight line along the lengthwise direction of the striated portions 3 is parallel to the lengthwise direction of the suspension-board-with-circuit assembly sheet 1 (hereinafter referred to as suspension-board-with-circuit assembly sheet C).

(1) When Loads F1 and F2 are Applied From the Same Direction:

As shown in FIG. 8(*a*), when the loads F1 and F2 were applied from the same direction, the suspension board with circuit(s) 2 in the suspension-board-with-circuit assembly sheet A (with no filamentary portion) was distorted. Such distortion was set to 0.071°. When the loads F1 and F2 were equally applied, the distortions of the suspension board with circuit(s) 2 in the suspension-board-with-circuit assembly sheet B (intersection angle α: 143°) and the suspension-board-with-circuit assembly sheet C (intersection angle α: 90 degrees) were measured.

As a result, in the suspension-board-with-circuit assembly sheet B (intersection angle α: 143°), the suspension board with circuit 2 was distorted at 0.057°, and the deformation thereof was reduced by 19.7%.

Further, in the suspension-board-with-circuit assembly sheet C (intersection angle α: 90°), the suspension board with circuit 2 was distorted at 0.064°, and the deformation thereof was reduced by 9.9%.

(2) When Loads F1 and F2 are Applied from Different Directions:

As shown in FIG. 8(*b*), when the loads F1 and F2 were applied from different directions, the suspension board with circuit(s) 2 in the suspension-board-with-circuit assembly sheet A (with no filamentary portion) was distorted. Such distortion was set to −0.073°. When the loads F1 and F2 were equally applied, the distortions of the suspension board with circuit(s) 2 in the suspension-board-with-circuit assembly sheet B (intersection angle α: 143°) and the suspension-board-with-circuit assembly sheet C (intersection angle α: 90 degrees) were measured.

As a result, in the suspension-board-with-circuit assembly sheet B (intersection angle α: 143°), the suspension board with circuit 2 was distorted at −0.057°, and the deformation thereof was reduced by 21.9%.

Further, in the suspension-board-with-circuit assembly sheet C (intersection angle α: 90°), the suspension board with circuit 2 was distorted at −0.056°, and the deformation was reduced by 23.3%.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board assembly sheet comprising:
   a support sheet;
   a plurality of wired circuit boards spaced apart with respect to each other and supported by the support sheet; and
   a plurality of rigidity-enhancing, striated portions disposed on a surface of the support sheet and extending between the respective wired circuit boards along a direction intersecting the lengthwise direction of the wired circuit boards,
   wherein the striated portions are disposed on the surface of the support sheet but are not disposed on any of the wired circuit boards.

2. The wired circuit board assembly sheet according to claim 1, wherein the striated portions are formed of a metal and/or a resin.

3. The wired circuit board assembly sheet according to claim 1, wherein the striated portions are spaced in parallel to each other.

4. The wired circuit board assembly sheet according to claim 1, wherein a bisector of an angle formed by intersecting straight lines along the lengthwise direction of the wired circuit boards and the lengthwise direction of the striated portions is parallel to the lengthwise direction of the wired circuit board assembly sheet.

5. The wired circuit board assembly sheet according to claim 1, wherein the striated portions are arranged along directions intersecting both the lengthwise direction of the wired circuit boards and a direction perpendicular to the lengthwise direction of the wired circuit boards.

6. The wired circuit board assembly sheet according to claim 1, wherein the striated portions are arranged on the support sheet in regions between the respective wired circuit boards.

7. The wired circuit board assembly sheet according to claim 1, wherein the wired circuit boards are suspension board with circuits.

* * * * *